(12) United States Patent
Cordos

(10) Patent No.: US 11,916,556 B1
(45) Date of Patent: Feb. 27, 2024

(54) METHOD OF OPERATION FOR A DATA LATCH CIRCUIT

(71) Applicant: ATI Technologies ULC, Markham (CA)

(72) Inventor: Ioan Cordos, Markham (CA)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/896,479

(22) Filed: Aug. 26, 2022

(51) Int. Cl.
*H03K 3/356* (2006.01)
*H03K 3/037* (2006.01)

(52) U.S. Cl.
CPC ....... *H03K 3/037* (2013.01); *H03K 3/356104* (2013.01)

(58) Field of Classification Search
CPC .................. H03K 3/037; H03K 3/356104
See application file for complete search history.

(56) References Cited

U.S. PATENT DOCUMENTS

| | | | |
|---|---|---|---|
| 2015/0116019 A1* | 4/2015 | Hsu | H03K 3/356104 327/202 |
| 2016/0065184 A1* | 3/2016 | Liu | H03K 3/037 327/225 |
| 2017/0170829 A1* | 6/2017 | Liu | H03K 19/0016 |
| 2018/0152175 A1* | 5/2018 | Lai | H03K 3/35625 |
| 2019/0074825 A1* | 3/2019 | Hwang | H03K 3/356121 |
| 2021/0184660 A1* | 6/2021 | Bhat | H03K 3/027 |
| 2022/0247388 A1* | 8/2022 | Hwang | G01R 31/318533 |
| 2022/0247391 A1* | 8/2022 | Li | H03K 19/20 |

* cited by examiner

*Primary Examiner* — Patrick O Neill
(74) *Attorney, Agent, or Firm* — Greenberg Traurig, LLP

(57) ABSTRACT

The disclosed method of operation for a data latch (DLATCH) circuit may include receiving, by an input component of the DLATCH circuit, an input signal. The method may additionally include storing, by a combinatorial gate of the DLATCH circuit, a state of the input signal, wherein the combinatorial gate corresponds to at least one of an AND-OR-inverted (AOI22) cell or an OR-AND-inverted (OAI22) cell. The method may further include providing an output signal, by an output component of the DLATCH circuit, wherein the output signal has the state stored by the combinatorial gate. Various other methods, systems, and circuits are also disclosed.

20 Claims, 10 Drawing Sheets

METHOD OF OPERATION FOR A DATA LATCH CIRCUIT

BACKGROUND

In semiconductor design, standard cell methodology is a method of designing application-specific integrated circuits (ASICs) with mostly digital-logic features. A standard cell is a group of transistor and interconnect structures that provides a boolean logic function (e.g., AND, OR, XOR, XNOR, inverters) or a storage function (e.g., flipflop or latch). A standard cell library is a collection of low-level electronic logic functions such as AND, OR, INVERT, flip-flops, latches, and buffers.

BRIEF DESCRIPTION OF THE DRAWINGS

The accompanying drawings illustrate a number of example embodiments and are a part of the specification. Together with the following description, these drawings demonstrate and explain various principles of the present disclosure.

Figure 1:
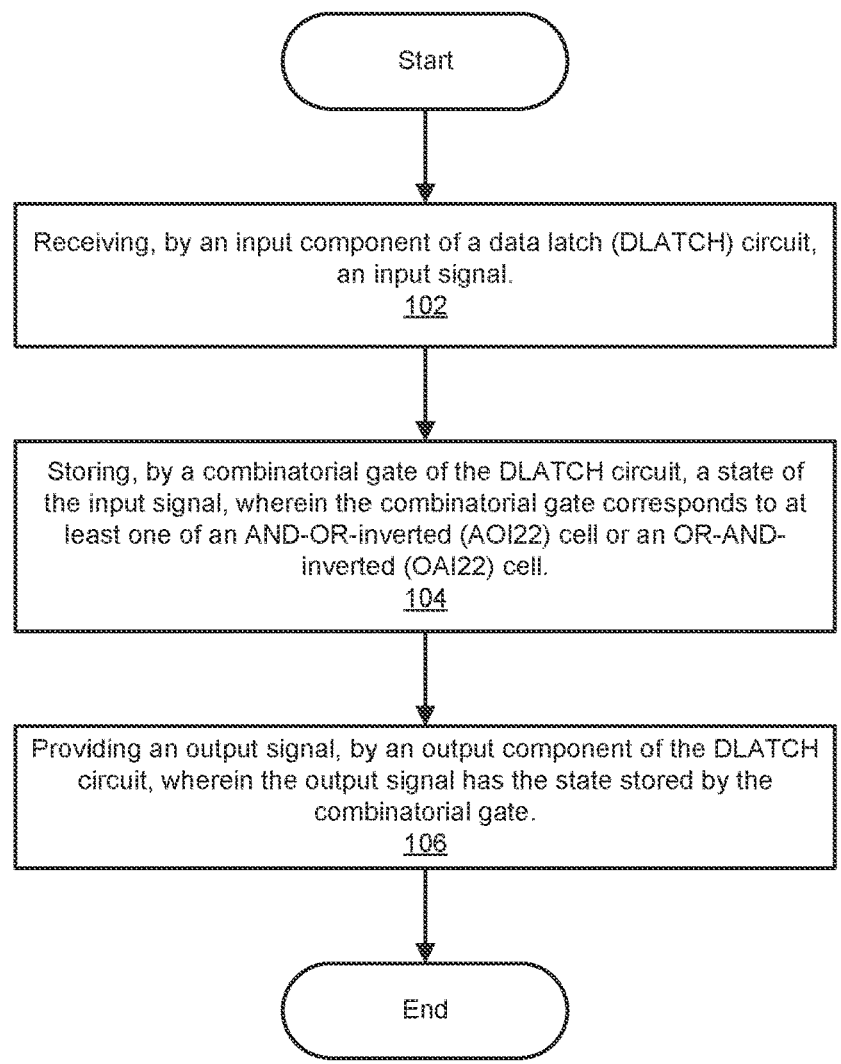
FIG. 1 is a flow diagram of an example method of operation for a data latch (DLATCH) circuit.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the present disclosure covers all modifications, equivalents, and alternatives falling within the scope of the appended claims.

DETAILED DESCRIPTION OF EXAMPLE EMBODIMENTS

The present disclosure is generally directed to a method of operation for a data latch (DLATCH) circuit. The disclosed DLATCH circuit addresses challenges arising in standard cell libraries, with architecture having limited traces for the first metal in the stack. In such architectures, challenges arise in implementing a clocked data latch due to impossibility of cutting polygate rails and connecting to both PMOS and NMOS in the same Poly track. As a result, conventional DLATCH designs, which have cross coupled clock signals, have active polygate rails that are cut. Active poly gates are those that form MOS devices that either contribute to functionality or are dummy devices. Dummy devices are often necessary for meeting design rules but are detrimental to circuit performance. In contrast, floating poly gates do not form MOS devices. Cutting active polygate rails requires addition of dummy devices that negatively impact delay of the DLATCH circuit.

The disclosed method of operation for a DLATCH circuit includes receiving, by an input component of the DLATCH circuit, an input signal. The method may additionally include storing, by a combinatorial gate of the DLATCH circuit, a state of the input signal, wherein the combinatorial gate corresponds to an AND-OR-inverted (AOI22) cell or an OR-AND-inverted (OAI22) cell. The method may further include providing an output signal, by an output component of the DLATCH circuit, wherein the output signal has the state stored by the combinatorial gate. Additional examples include a data latch circuit and an integrated circuit that includes the data latch circuit.

Numerous advantages arise with the disclosed method. For example, a combinatorial gate that corresponds to AOI22 cell or an OAI22 cell is more compact than other types of gate circuits in terms of cell physical area. Additionally, a combinatorial gate that corresponds to AOI22 cell or an OAI22 cell has no need for cross-coupled clock signals. This more compact gate circuitry having no need for cross-coupled clock signals provides for a layout having fewer polygate rails (i.e., reduced cell width), elimination of to cut any active polygate rails, and elimination of need for dummy devices. As a result, a smaller cell layout is achieved at less expense and with greater freedom in layout design. Another advantage stems from the option to utilize either an AOI22 cell or a OAI22 cell for the circuit, as these cells exhibit substantially equal and opposite delay skew. As a result, a designer of an IC may connect two of the disclosed DLATCH circuits in series to cancel each other's delay skew, one having an AOI22 cell-based combinatorial gate and the other having an OAI22 cell-based combinatorial gate. Moreover, a designer of an IC may choose to use either the AOI22 cell or OAI22 cell type of the DLATCH circuit to reduce or eliminate delay skew of one or more other circuits of the IC at a tile level.

Example Implementations

Example 1: A method of operation for a data latch circuit includes receiving, by an input component of the circuit, an input signal, storing, by a combinatorial gate of the circuit, a state of the input signal, wherein the combinatorial gate corresponds to at least one of an and-or-inverted cell or an or-and-inverted cell, and providing an output signal, by an output component of the DLATCH circuit, wherein the output signal has the state stored by the combinatorial gate.

Example 2. The method of example 1, wherein the combinatorial gate corresponds to the and-or-inverted cell.

Example 3. The method of any of examples 1 or 2, wherein the combinatorial gate corresponds to the or-and-inverted cell.

Example 4. The method of any of examples 1-3, wherein the or-and-inverted cell has a delay skew that is faster falling than rising and the method further includes compensating a faster rising than falling delay skew of one or more circuits of an integrated circuit at a tile level thereof.

Example 5. The method of any of examples 1-4, wherein the data latch circuit has no cross coupled clock signals.

Example 6. The method of any of examples 1-5, wherein the data latch circuit has no dummy metal oxide semiconductor devices.

Example 7. The method of any of examples 1-6, wherein a layout of the data latch circuit has no cut polygate on any active polygate rail of the data latch circuit.

Example 8. The method of claim 1, any of examples 1-7 wherein a layout of the data latch circuit has no more than twelve polygate rails and no more than eleven polygate rails in terms of cell width.

Example 9. A data latch circuit includes an input component configured to receive an input signal, a combinatorial gate configured to store a state of the input signal, wherein the combinatorial gate corresponds to at least one of an and-or-inverted cell or an or-and-inverted cell, and an output component configured to provide an output signal having the state stored by the combinatorial gate.

Example 10. The data latch circuit of example 9, wherein the combinatorial gate corresponds to the and-or-inverted cell.

Example 11. The data latch circuit of any of examples 9 or 10, wherein the combinatorial gate corresponds to the or-and-inverted cell. Example 12. The data latch circuit of any of examples 9-12, wherein the or-and-inverted cell has a delay skew that is faster falling than rising, and the data latch circuit is configured to compensate a faster rising than falling delay skew of one or more circuits of an integrated circuit at a tile level thereof.

Example 13. The data latch circuit of any of examples 9-12, wherein the data latch circuit has no cross coupled clock signals.

Example 14. The data latch circuit of any of examples 9-13, wherein the data latch circuit has no dummy metal oxide semiconductor devices.

Example 15. The data latch circuit of any of examples 9-14, wherein a layout of the data latch circuit has no cut polygate on any active polygate rail of the data latch circuit.

Example 16. The data latch circuit of any of examples 9 to 15, wherein a layout of the data latch circuit has no more than twelve polygate rails and no more than eleven polygate rails in terms of cell width.

Example 17. An integrated circuit includes one or more circuits and a data latch circuit operatively connected to the one or more circuits, wherein the data latch circuit has an input component configured to receive an input signal, a combinatorial gate configured to store a state of the input signal, and an output component configured to provide an output signal having the state stored by the combinatorial gate, and wherein the combinatorial gate corresponds to at least one of an and-or-inverted cell or an or-and-inverted cell.

Example 18. The integrated circuit of example 17, wherein the combinatorial gate corresponds to the or-and-inverted cell, the or-and-inverted cell has a delay skew that is faster falling than rising, and the data latch circuit is configured to compensate a faster rising than falling delay skew of the one or more circuits at a tile level of the integrated circuit.

Example 19. The integrated circuit of any of examples 17 or 18, wherein the data latch circuit has no cross coupled clock signals.

Example 20. The integrated circuit of any of examples -17-19, wherein the data latch circuit has no dummy metal oxide semiconductor devices.

The following will provide, with reference to FIG. 1, a method of operation for a DLATCH circuit having a combinatorial gate corresponding to the AOI22 cell or OAI22 cell. Additionally, features and disadvantages of a tristate-gate DLATCH circuit will be described with reference to FIGS. 2 and 3. Also, features and advantages of the DLATCH circuit having the combinatorial gate corresponding to the AOI22 cell or the OAI22 cell will be described with reference to FIGS. 4-9. Further, features and advantages of an integrated circuit (IC) including the DLATCH circuit having the combinatorial gate corresponding to the AOI22 cell or the OAI22 cell will be described with reference to FIG. 10.

In semiconductor design, standard cell methodology is a method of designing application-specific integrated circuits (ASICs) with mostly digital-logic features. Standard cell methodology is an example of design abstraction, whereby a low-level very-large-scale integration (VLSI) layout is encapsulated into an abstract logic representation (such as a NAND gate).

Cell-based methodology makes it possible for one designer to focus on the high-level aspect of digital design, while another designer focuses on the implementation aspect. Along with semiconductor manufacturing advances, standard cell methodology has helped designers scale ASICs from comparatively simple single-function ICs (of several thousand gates), to complex multi-million gate system-on-a-chip (SoC) devices.

A standard cell is a group of transistor and interconnect structures that provides a boolean logic function (e.g., AND, OR, XOR, XNOR, inverters) or a storage function (e.g., flipflop or latch). The simplest cells are direct representations of the elemental NAND, NOR, and XOR boolean function, although cells of much greater complexity are commonly used (e.g., a 2-bit full-adder, or muxed D-input flipflop.)

A standard cell library is a collection of low-level electronic logic functions such as AND, OR, INVERT, flip-flops, latches, and buffers. These cells are realized as fixed-height, variable-width full-custom cells. A key aspect with these libraries is that they are of a fixed height, which enables them to be placed in rows, easing the process of automated digital layout. The cells are typically optimized full-custom layouts, which minimize delays and area.

In standard cell libraries, with architecture having limited traces for the first metal in the stack, challenges arise in implementing a clocked data latch due to impossibility of cutting Poly sticks and connecting to both PMOS and NMOS in the same Poly track. The present disclosure addresses these challenges.

Figure 3:
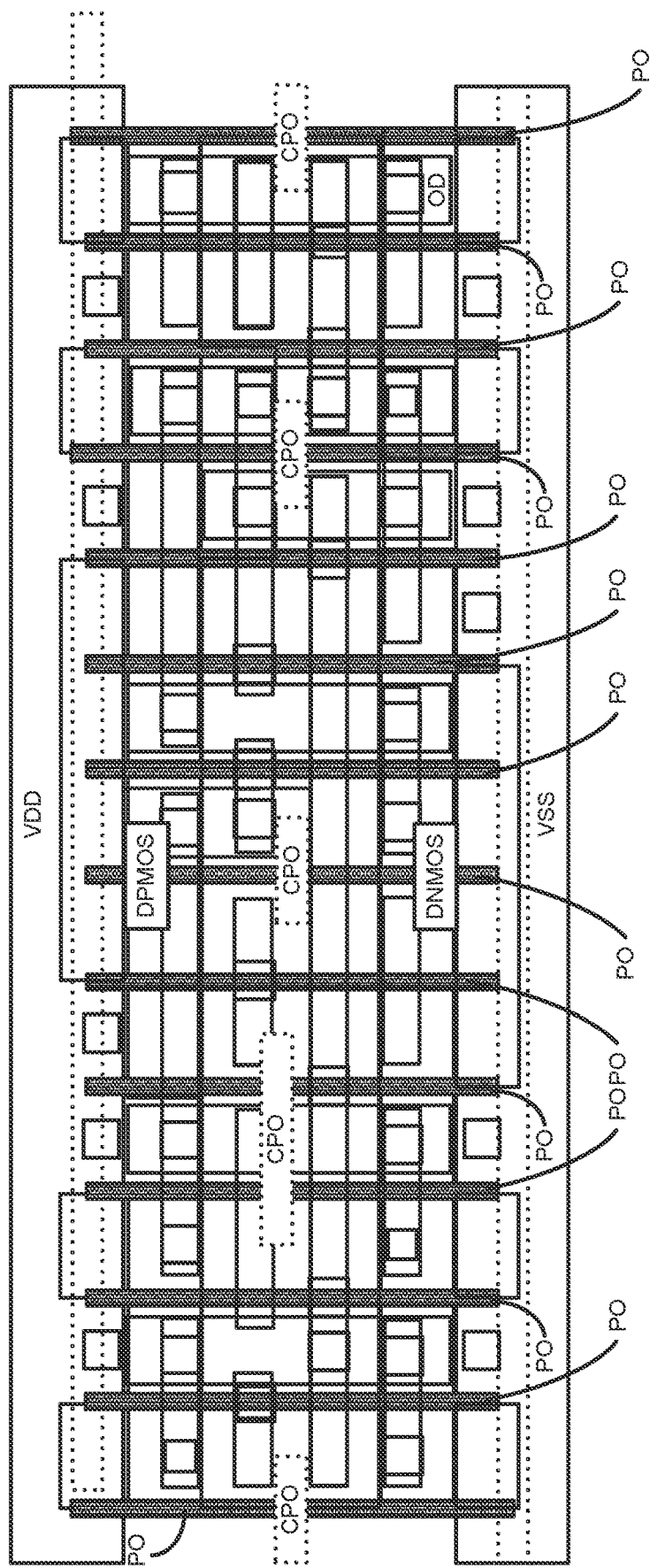
FIG. 3 is a block diagram illustrating a layout for the tristate-gate data latch circuit.

FIG. 1 is a flow diagram of an example method 100 of operation for a DLATCH circuit. According to various implementations, the steps shown in FIG. 1 are performed by any suitable analog and/or digital circuit components, computer-executable code, and/or computing system, such as circuits described with reference to FIGS. 4-9. In one example, each of the steps shown in FIG. 3 represent multiple sub-steps, examples of which will be provided in greater detail below.

As illustrated in FIG. 1, at step 102 one or more of the systems and/or circuits described herein receives, by an input component of the DLATCH circuit, an input signal. In some examples, one or more input signals is received by one or more pins of a DLATCH circuit.

The systems and circuits described herein may perform step 102 in a variety of ways. In some implementations, the input signal corresponds to a digital signal received by a data pin communicatively coupled to an internal data net of a DLATCH circuit. In these and other implementations, an enable signal is also received at step 102. In some examples, the enable signal corresponds to a clock signal received by an enable pin of the DLATCH circuit.

At step 104, one or more of the systems or circuits described herein stores, by a combinatorial gate of the DLATCH circuit, a state of the input signal received at step 102. For example, the combinatorial gate corresponds to an AOI22 cell and/or an OAI22 cell. In some of these examples, the combinatorial gate stores the state of a data signal received by a data pin of the DLATCH circuit in response to a state of an enable signal received by an enable pin of the DLATCH circuit.

Various implementations of the systems and circuits described herein perform step 104 in a variety of ways. In some implementations, the combinatorial gate corresponds to the AOI22 cell. In other implementations, the combinatorial gate corresponds to the OAI22 cell. In these and other implementations, the DLATCH circuit has no cross coupled clock signals. In these or other implementations, the DLATCH circuit has no dummy metal oxide semiconductor (MOS) devices. In these or other implementations, a layout of the DLATCH circuit has no cut polygate on any active polygate rail of the DLATCH circuit. Cutting of active polygate rails impacts performance of the DLATCH circuit.

At step 106, one or more of the systems or circuits described herein provides an output signal, by an output component of the DLATCH circuit, wherein the output signal has the state stored, at step 104, by the combinatorial gate. In some of these implementations, the output is provided at step 104 by an output pin of the DLATCH circuit. In some of these implementations, the provided output signal changes according to the input signal received at step 102 in response to a state of an enable signal received at step 102. For example, the or-and-inverted cell has a delay skew that is faster falling than rising, and thus steps 102-106 may compensate a faster rising than falling delay skew of one or more circuits of an integrated circuit at a tile level thereof.

In various implementations, the systems and circuits described herein perform step 104 in a variety of ways. In some implementations, the output signal provided at step 106 exhibits a delay skew. In some of these implementations, the delay skew corresponds to a first delay skew (i.e., faster rising than falling) introduced by a combinatorial gate corresponding to the AOI22 cell. In other of these implementations, the delay skew corresponds to a second delay skew (i.e., faster falling than rising) introduced by a combinatorial gate corresponding to the OAI22 cell. In some implementations, the first delay skew introduced by the AOI22 cell is substantially equal and opposite the second delay skew introduced by the OAI22 cell. In some implementations, the input signal received at step 102 has a delay skew introduced by one or more other circuits that provide the input signal. In these implementations, the delay skew of the input signal is at least partially compensated by the delay skew introduced by the DLATCH circuit, such that the output signal provided at step 106 has a reduced delay skew compared to the delay skew of the input signal. In these and other implementations, a delay skew of the output signal provided at step 106 compensates another delay skew introduced by one or more other circuits that receive the output signal. Stated differently, some implementations of the method have a combinatorial gate of an AOI22 cell type or an OAI22 cell type selected to compensate delay skew of one or more other circuits at a tile level of an IC. Accordingly, in these implementations of the method, steps 102-106 include compensating delay skew of an integrated circuit at a tile level thereof.

Figure 2:
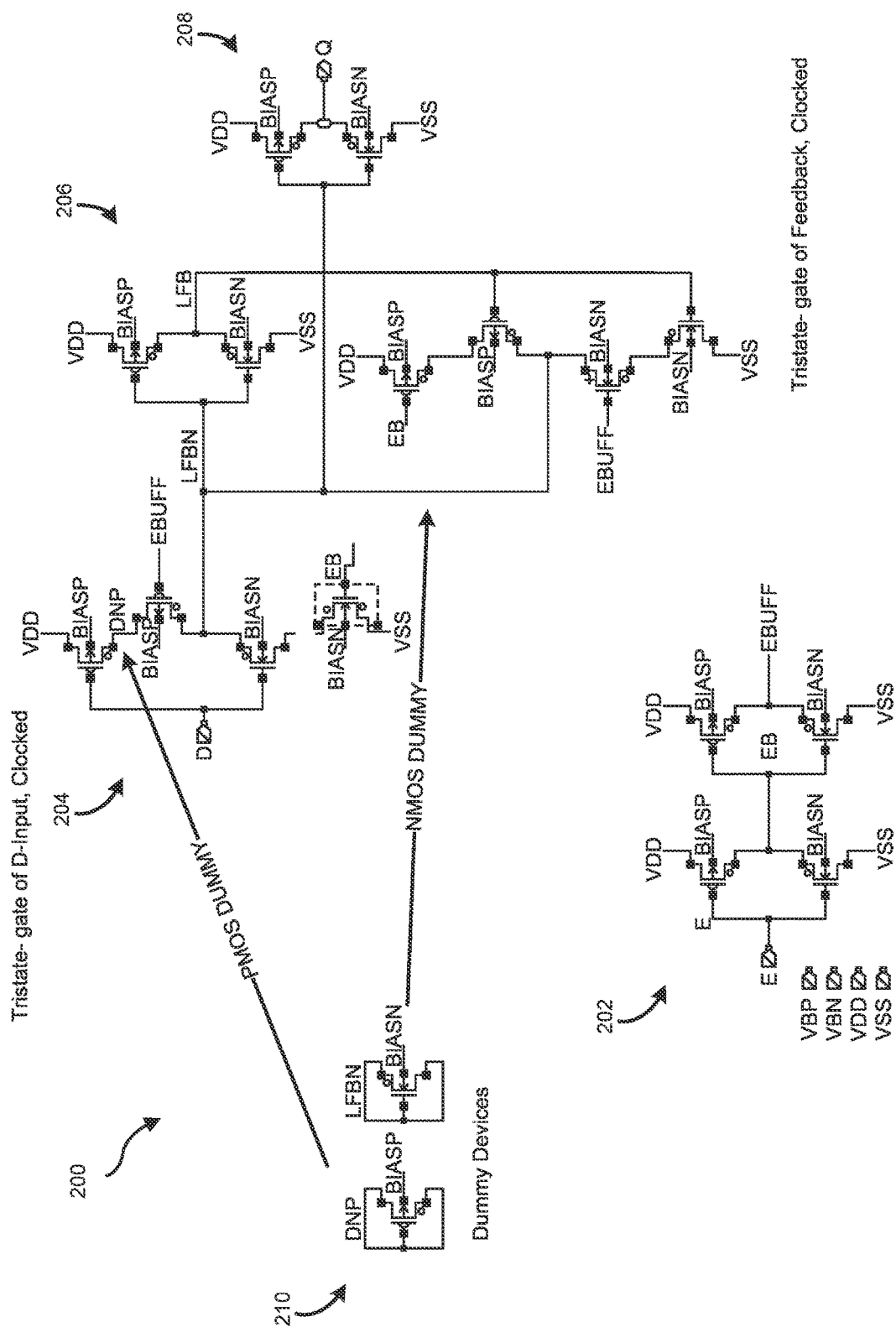
FIG. 2 is an electrical circuit diagram illustrating a tristate-gate data latch circuit.

FIG. 2 illustrates an example tristate-gate DLATCH circuit 200. Tristate-gate DLATCH circuit 200 has two input signals corresponding to a data signal D and an enable signal E. In some implementations, enable signal E corresponds to a clock signal. Tristate-gate DLATCH circuit 200 also has an output signal Q that has a state changing to a state of input signal D when enable signal E is high and that remains latched at that state when enable signal E is low.

Tristate-gate DLATCH circuit 200 has enable signal internal net elements 202 that process the enable signal E to produce an inverted enable signal EB and a buffered enable signal EBUFF that is fully buffered from outside noise. Enable signal internal net elements 202 connect to a voltage VDD provided by a power rail, and voltage VDD is greater than zero voltage measurable between 0.6V and 1.2V. Enable signal internal net elements 202 additionally connect to a voltage VSS provided by another power rail, and voltage VSS corresponds to a ground/reference voltage. Enable signal internal net elements 202 include transistors arranged to produce inverted enable signal EB and buffered enable signal EBUFF based on enable signal E and bias voltages corresponding to a voltage bias positive BIASP and a voltage bias negative BIASN.

Tristate-gate DLATCH circuit 200 additionally has tristate-gate elements 204 that process the data signal D to produce, in part, a latch feedback negative signal LFBN. Tristate-gate elements 204 are connected to voltage VDD and voltage VSS, and include transistors arranged to produce, in part, latch feedback negative signal LFBN based on data signal D, inverted enable signal EB, buffered enable signal EBUFF, and bias voltages, including voltage bias positive BIASP and voltage bias negative BIASN.

Tristate-gate DLATCH circuit 200 also has latch elements 206 that produce, in part, latch feedback negative signal LFBN. Latch elements 206 are connected to voltage VDD and voltage VSS, and include transistors arranged to produce a latch feedback signal LFB and produce, in part, latch feedback negative signal LFBN. Latch elements 206 are configured to produce, in part, latch feedback negative signal LFBN based on latch feedback signal LFB, inverted enable signal EB, buffered enable signal EBUFF, and bias voltages, including voltage bias positive BIASP and voltage bias negative BIASN.

Tristate-gate DLATCH circuit 200 further has output signal internal net elements 208 that process the latch feedback negative signal LFBN to produce an output signal Q. Output signal internal net elements 208 are connected to voltage VDD and voltage VSS, and include transistors arranged to produce output signal Q based on the latch feedback negative signal LFBN and bias voltages, including voltage bias positive BIASP and voltage bias negative BIASN.

Tristate-gate DLATCH circuit 200 still further has dummy devices 210, including a PMOS dummy device and an NMOS dummy device. The PMOS Dummy device hangs on an input tristate inverter of tristate-gate elements 204 at location DNP, negatively impacting the timing and power for the tristate-gate DLATCH. The NMOS Dummy device hangs on a state node of latch elements 206, primarily impacting timing of the tristate DLATCH. Due in part to use of dummy devices, tristate-gate DLATCH circuit 200 has a delay skew (i.e., faster rising than falling) that is relatively large (e.g., in a given technology and at a given voltage and temperature, a delay rise of 5.9 picoseconds (ps) and a delay fall of 6.7 ps).

As the tristate-gate elements 204 and latch elements 206 of the tristate-gate circuit cooperate to produce latch feedback negative signal LFBN, and as both of these groups of circuit elements produce LFBN based on inverted enable signal EB and buffered enable signal EBUFF, the internal clock signals (e.g., inverted enable signal EB and buffered enable signal EBUFF) of the circuit are cross-coupled. The cross-coupling of these clock signals necessitates cutting of polygate rails of the layout, including active polygate rails. Cutting the active polygate rails is addressed by increasing the number of polygate rails and adding dummy devices.

FIG. 3 illustrates a layout of the tri-state DLATCH. As shown, fourteen polygate rails PO are arranged vertically across a VDD power rail and a VSS power rail. Several cut polygates CPO are made in the rails, including active polygate rails, and dummy devices DNMOS and DPMOS are arranged on one of the cut active polygate rails. Although the total count of polygate rails PO in the layout is fourteen, the leftmost and rightmost poly gate rails normally overlap with those of a different cell. As a result, a cell width is normally viewed as corresponding to the distance between a midpoint of a leftmost polygate rail of a cell and a midpoint of a rightmost polygate rail of the cell, yielding a total cell width of this cell containing a total of thirteen polygate rails.

AOI logic and AOI gates are two-level compound (or complex) logic functions constructed from the combination of one or more AND gates followed by a NOR gate. Construction of AOI cells is particularly efficient using CMOS technology, where the total number of transistor gates can be compared to the same construction using NAND logic or NOR logic. The complement of AOI logic is OAI logic, in which the OR gates precede a NAND gate. AOI and OAI gates can be readily implemented in circuitry. AOI gates are particularly advantaged in that the total number of transistors (or gates) is less than if the AND, NOT, and OR functions were implemented separately. This reduction results in increased speed, reduced power, smaller area, and potentially lower fabrication cost.

Figure 4:
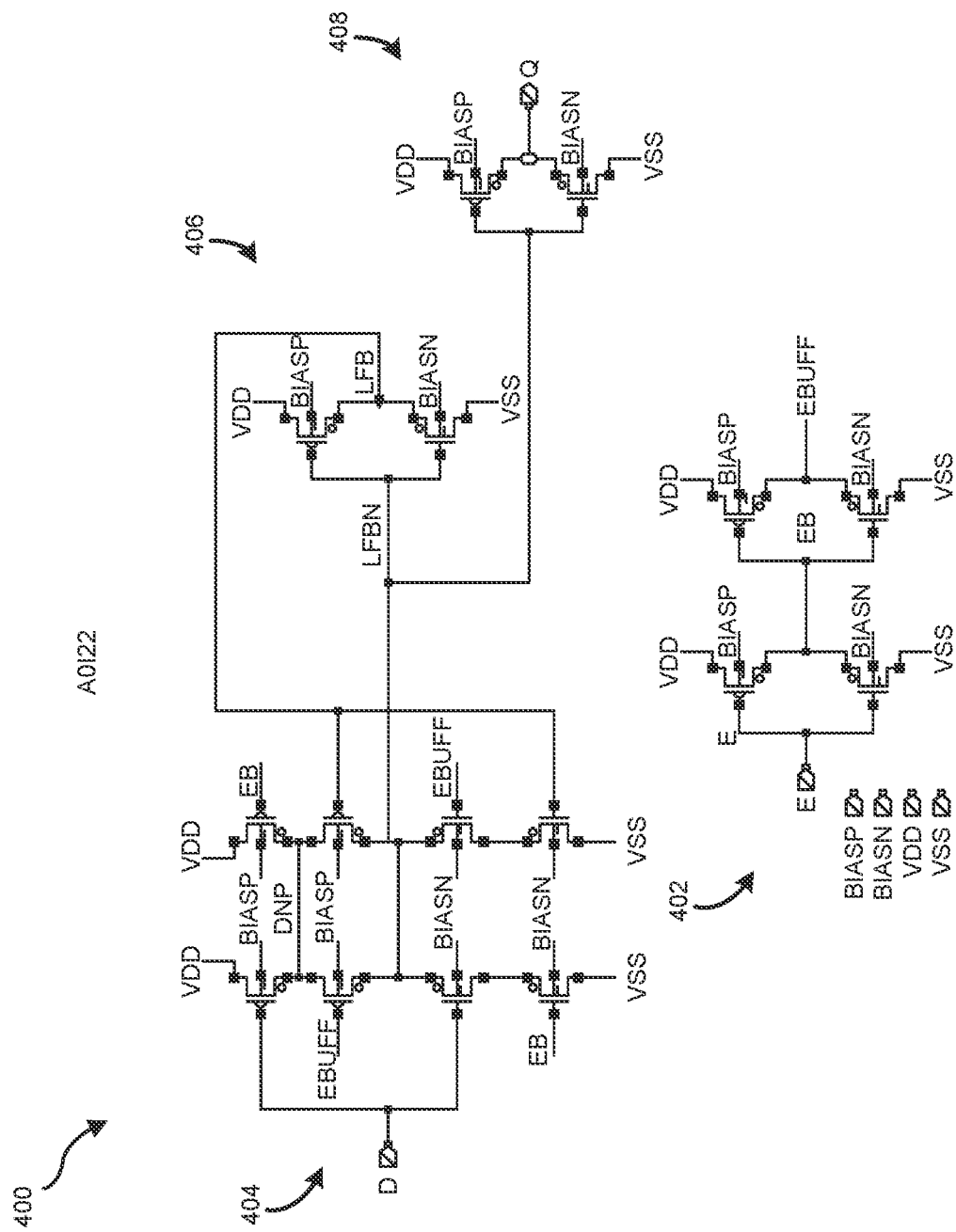
FIG. 4 is an electrical circuit diagram illustrating a DLATCH circuit having a combinatorial gate corresponding to an AOI22 cell.

FIG. 4 illustrates a DLATCH circuit 400 having a combinatorial gate corresponding to an AND-OR-inverted (AOI22) cell. DLATCH circuit 400 has two input signals corresponding to a data signal D and an enable signal E. In some implementations, enable signal E corresponds to a clock signal. DLATCH circuit 400 also has an output signal Q that has a state changing to a state of input signal D when enable signal E is high and that remains latched at that state when enable signal E is low.

DLATCH circuit 400 has enable signal internal net elements 402 that process the enable signal E to produce an inverted enable signal EB and a buffered enable signal EBUFF that is fully buffered from outside noise. Enable signal internal net elements 402 connect to a voltage VDD provided by a power rail, and voltage VDD is greater than zero voltage measurable between 0.6V and 1.2V. Enable signal internal net elements 402 additionally connect to a voltage VSS provided by another power rail, and voltage VSS corresponds to a ground/reference voltage. Enable signal internal net elements 402 include transistors arranged to produce inverted enable signal EB and buffered enable signal EBUFF based on enable signal E and bias voltages corresponding to a voltage bias positive BIASP and a voltage bias negative BIASN.

DLATCH circuit 400 additionally has AOI22 gate elements 404 that process the data signal D to produce, in part, a latch feedback negative signal LFBN. AOI22 gate elements 404 are connected to voltage VDD and voltage VSS, and include transistors arranged to produce, in part, latch feedback negative signal LFBN based on data signal D, inverted enable signal EB, buffered enable signal EBUFF, and bias voltages, including voltage bias positive BIASP and voltage bias negative BIASN.

DLATCH circuit 400 also has latch elements 406 that produce, in part, latch feedback negative signal LFBN. Latch elements 406 are connected to voltage VDD and voltage VSS, and include transistors configured as an inverter that produces latch feedback signal LFB from latch feedback negative signal LFBN provided by AOI22 gate elements 404. Latch elements 406 are configured to produce, in part, latch feedback negative signal LFBN based on the latch feedback signal LFB and bias voltages, including voltage bias positive BIASP and voltage bias negative BIASN.

DLATCH circuit 400 further has output signal internal net elements 408 that process the latch feedback negative signal LFBN to produce an output signal Q. Output signal internal net elements 408 are connected to voltage VDD and voltage VSS, and include transistors arranged to produce output signal Q based on the latch feedback negative signal LFBN and bias voltages, including voltage bias positive BIASP and voltage bias negative BIASN. Due to the use of AOI22 gate elements 404 and elimination of dummy devices, DLATCH circuit 400 has a delay skew (i.e., faster rising than falling) that is reduced (e.g., in the given technology and at the given voltage and temperature, a delay rise 5.2 ps and a delay fall 6.1 ps) compared to that of tristate-gate DLATCH circuit 200.

Figure 5:
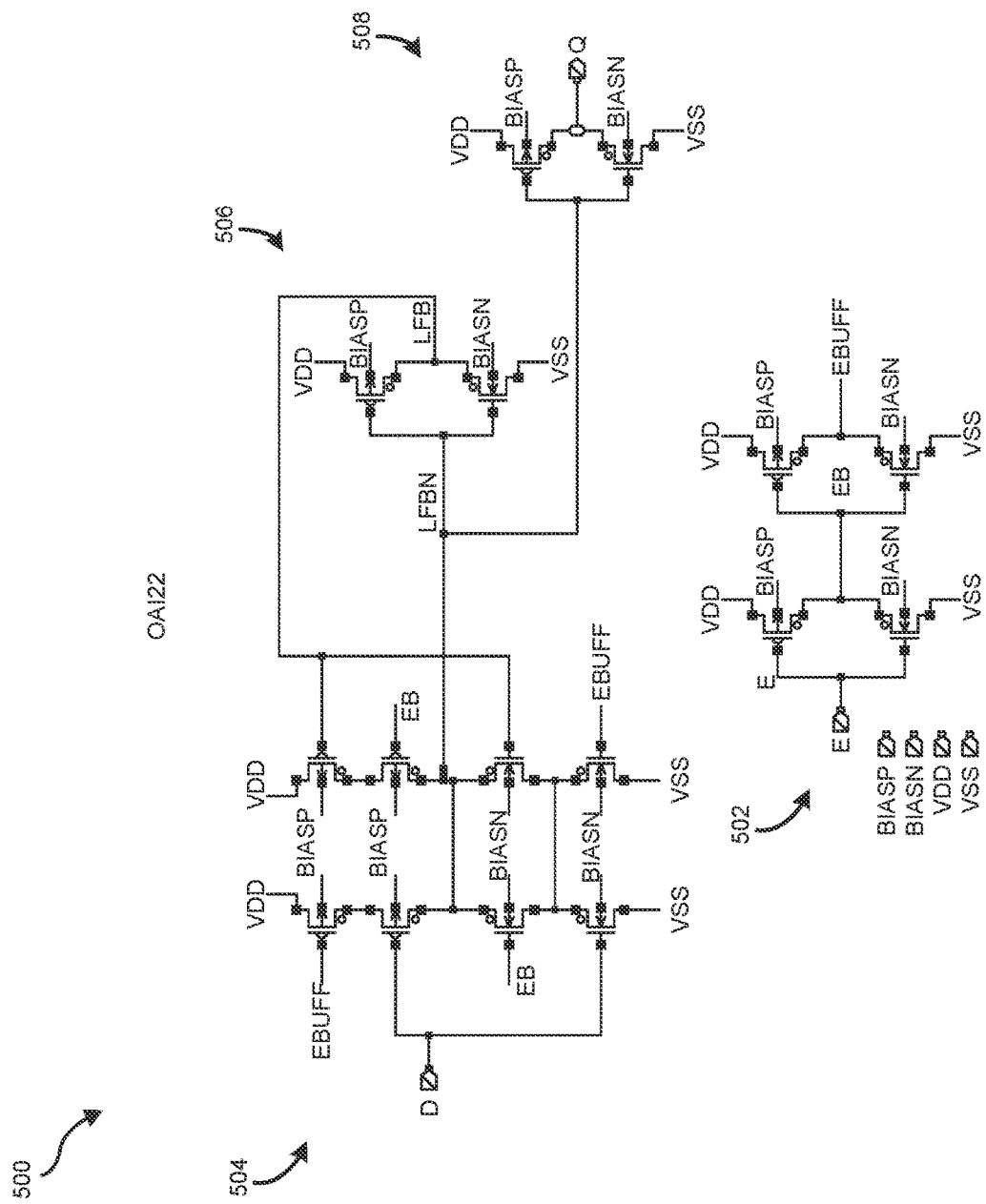
FIG. 5 is an electrical circuit diagram illustrating a DLATCH circuit having a combinatorial gate corresponding to an OAI22 cell.

FIG. 5 is an electrical circuit diagram illustrating a DLATCH circuit having a combinatorial gate corresponding to an OR-AND-inverted (OAI22) cell. DLATCH circuit 500 has two input signals corresponding to a data signal D and an enable signal E. In some implementations, enable signal E corresponds to a clock signal. DLATCH circuit 500 also has an output signal Q that has a state changing to a state of input signal D when enable signal E is high and that remains latched at that state when enable signal E is low.

DLATCH circuit 500 has enable signal internal net elements 502 that process the enable signal E to produce an inverted enable signal EB and a buffered enable signal EBUFF that is fully buffered from outside noise. Enable signal internal net elements 502 connect to a voltage VDD provided by a power rail, and voltage VDD is greater than zero voltage measurable between 0.6V and 1.2V. Enable signal internal net elements 502 additionally connect to a voltage VSS provided by another power rail, and voltage VSS corresponds to a ground/reference voltage. Enable signal internal net elements 502 include transistors arranged to produce inverted enable signal EB and buffered enable signal EBUFF based on enable signal E and bias voltages corresponding to a voltage bias positive BIASP and a voltage bias negative BIASN.

DLATCH circuit 500 additionally has OAI22 gate elements 504 that process the data signal D to produce, in part, a latch feedback negative signal LFBN. OAI22 gate elements 504 are connected to voltage VDD and voltage VSS, and include transistors arranged to produce, in part, latch feedback negative signal LFBN based on data signal D, inverted enable signal EB, buffered enable signal EBUFF, and bias voltages, including voltage bias positive BIASP and voltage bias negative BIASN.

DLATCH circuit 500 also has latch elements 506 that produce, in part, latch feedback negative signal LFBN. Latch elements 506 are connected to voltage VDD and voltage VSS, and include transistors configured as an inverter that produces latch feedback signal LFB from latch feedback negative signal LFBN provided by OAI22 gate elements 504. Latch elements 506 are configured to produce, in part, latch feedback negative signal LFBN based on the latch feedback signal LFB and bias voltages, including voltage bias positive BIASP and voltage bias negative BIASN.

DLATCH circuit 500 further has output signal internal net elements 508 that process the latch feedback negative signal LFBN to produce an output signal Q. Output signal internal net elements 508 are connected to voltage VDD and voltage VSS, and include transistors arranged to produce output signal Q based on the latch feedback negative signal LFBN and bias voltages, including voltage bias positive BIASP and voltage bias negative BIASN. Due to the use of OAI22 gate elements 504 and elimination of dummy devices, DLATCH circuit 500 has a delay skew that is opposite (i.e., faster falling than rising) to that of both DLATCH circuit 400 and tristate-gate DLATCH circuit and substantially equal in magnitude (e.g., in the given technology and at a given voltage and temperature, a delay rise of 5.8 ps and a delay fall of 5.6 ps) to that of DLATCH circuit 500.

Figure 6:
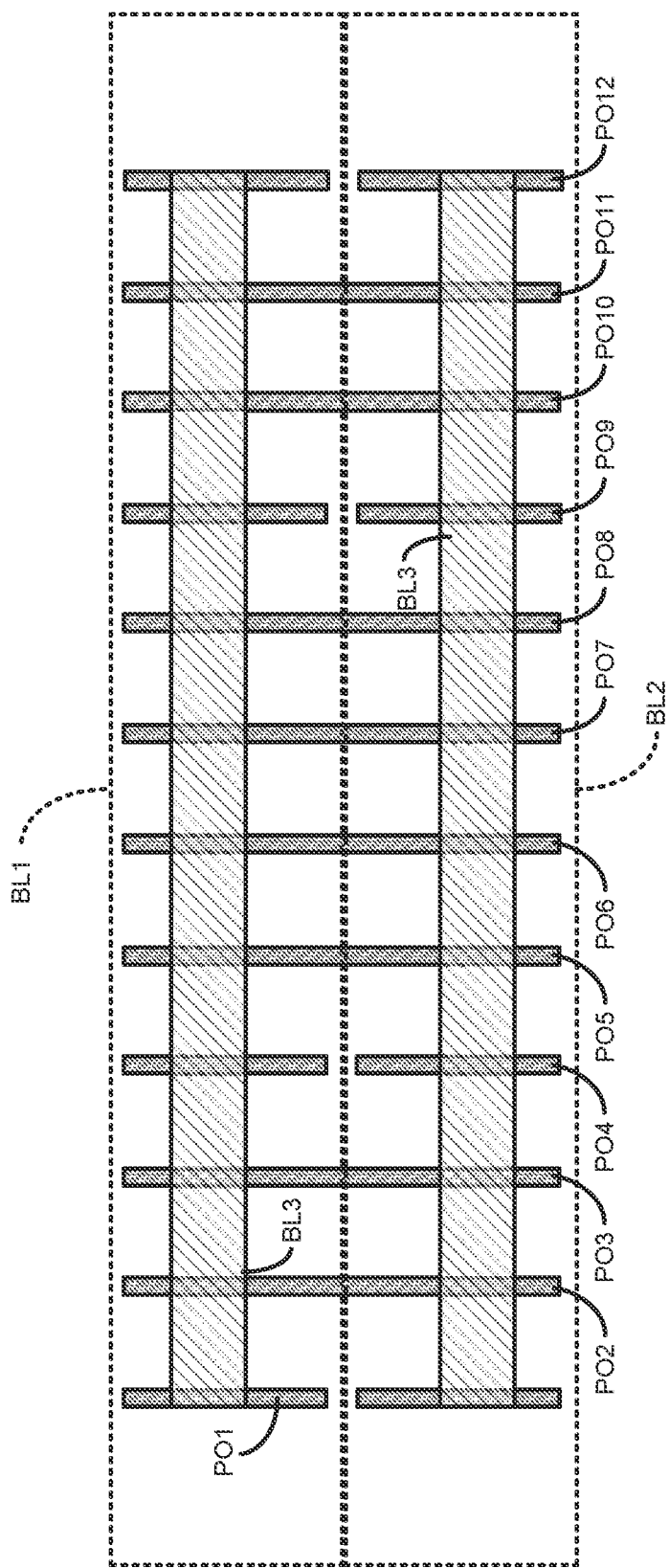
FIG. 6 is a block diagram illustrating bottom layers of a layout for the DLATCH circuit having the combinatorial gate corresponding to the AOI22 cell.

FIG. 6 illustrates bottom layers of a layout for the DLATCH circuit having the combinatorial gate corresponding to the AOI22 cell. An N-well BL1 and a P-well BL2 are provided at upper and lower portions of the layout, respectively. Within the two wells BL1 and BL2, a pair of oxide diffusions form a bottom layer BL3 arranged horizontally. Twelve vertical polygate rails PO1-PO12 are shown for purposes of positional reference.

Figure 7:
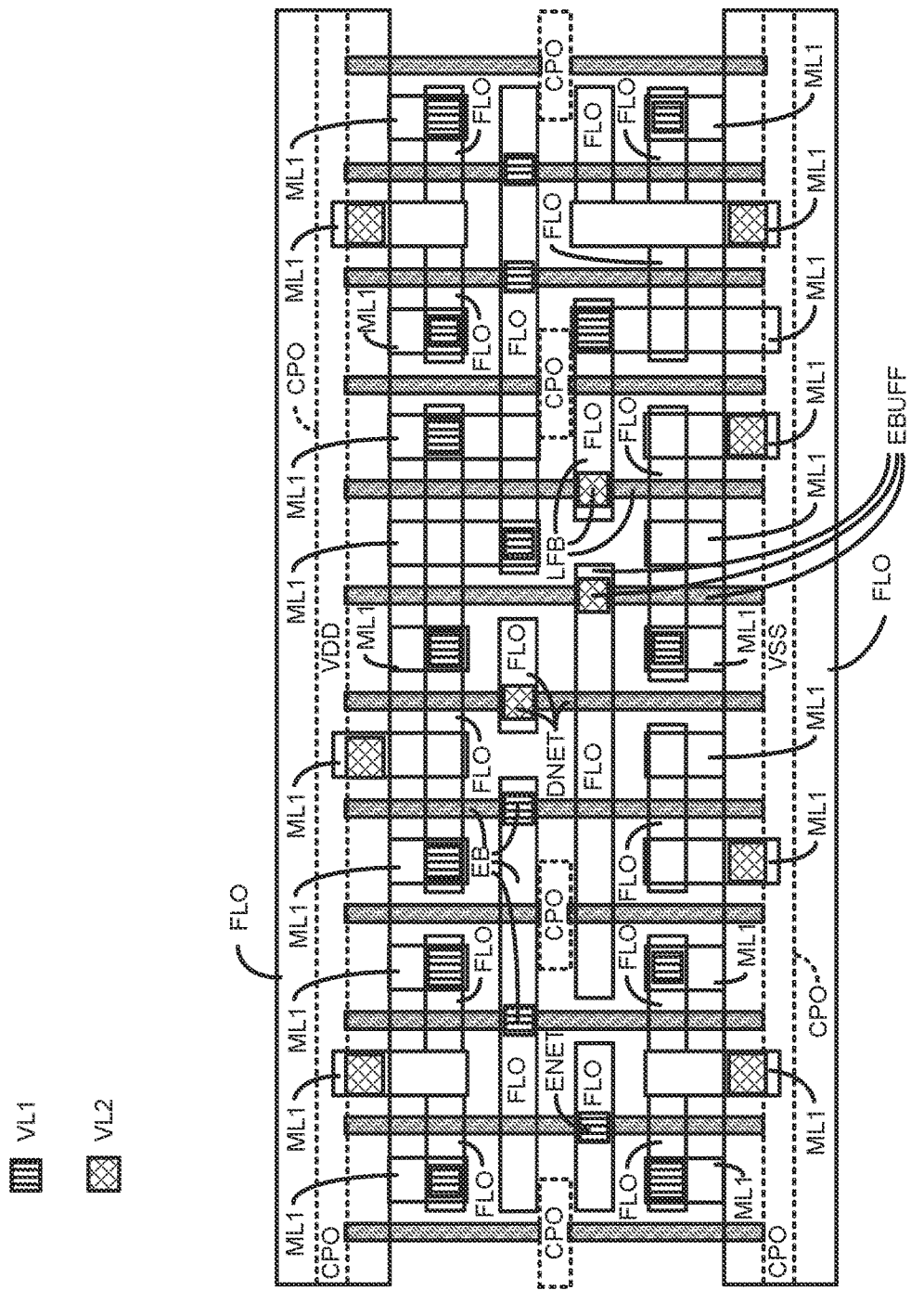
FIG. 7 is a block diagram illustrating middle layers of the layout for the DLATCH circuit having the combinatorial gate corresponding to the AOI22 cell.

FIG. 7 illustrates middle layers of the layout for the DLATCH circuit having the combinatorial gate corresponding to the AOI22 cell. A middle line metal layer ML1 is provided as a plurality of vertical metal plates. The twelve vertical polygate rails PO are also provided in the middle layers. Four of the polygate rails (PO1, PO4, PO9, and PO12 of FIG. 6), correspond to floating rails, which do not impact performance of the DLATCH circuit. These floating rails are cut by cut polygates CPO, and two additional cut polygates CPO are provided across the upper and lower portions of the middle layers. These cut polygates CPO are provided for the case that PMOS and NMOS gates are not on the same net. Via gates VL2 and via drains VL1 are also provided. An element labeled as ENET (e.g., via drain VL1) functions as part of the enable signal internal net elements. A first front end metal layer FL0 is shown for purposes of positional reference. Elements labeled as DNET (e.g, a first via gate VL2, a first component of the first front end metal layer FL0, and a first polygate rail (e.g., polygate rail PO6 of FIG. 6)) function as part of an input signal internal net. Elements labeled as EB (e.g., two via drains VL1, a second component of the front end metal layer FL0, and a second polygate rail (e.g., polygate rail PO5 of FIG. 6)) function as elements of an inverted enable signal internal net. Elements labeled as EBUFF (a second via gate VL2, a third component of the front end metal layer FL0, and a third polygate rail (e.g., polygate rail PO7 of FIG. 6)) function as part of a buffered enable signal internal net. Elements labeled as LFB (e.g., a third via gate VL2, a fourth component of the front end metal layer FL0, and a fourth polygate rail (e.g., polygate rail PO8 in FIG. 6), function as elements of a latch feedback internal net.

Figure 8:
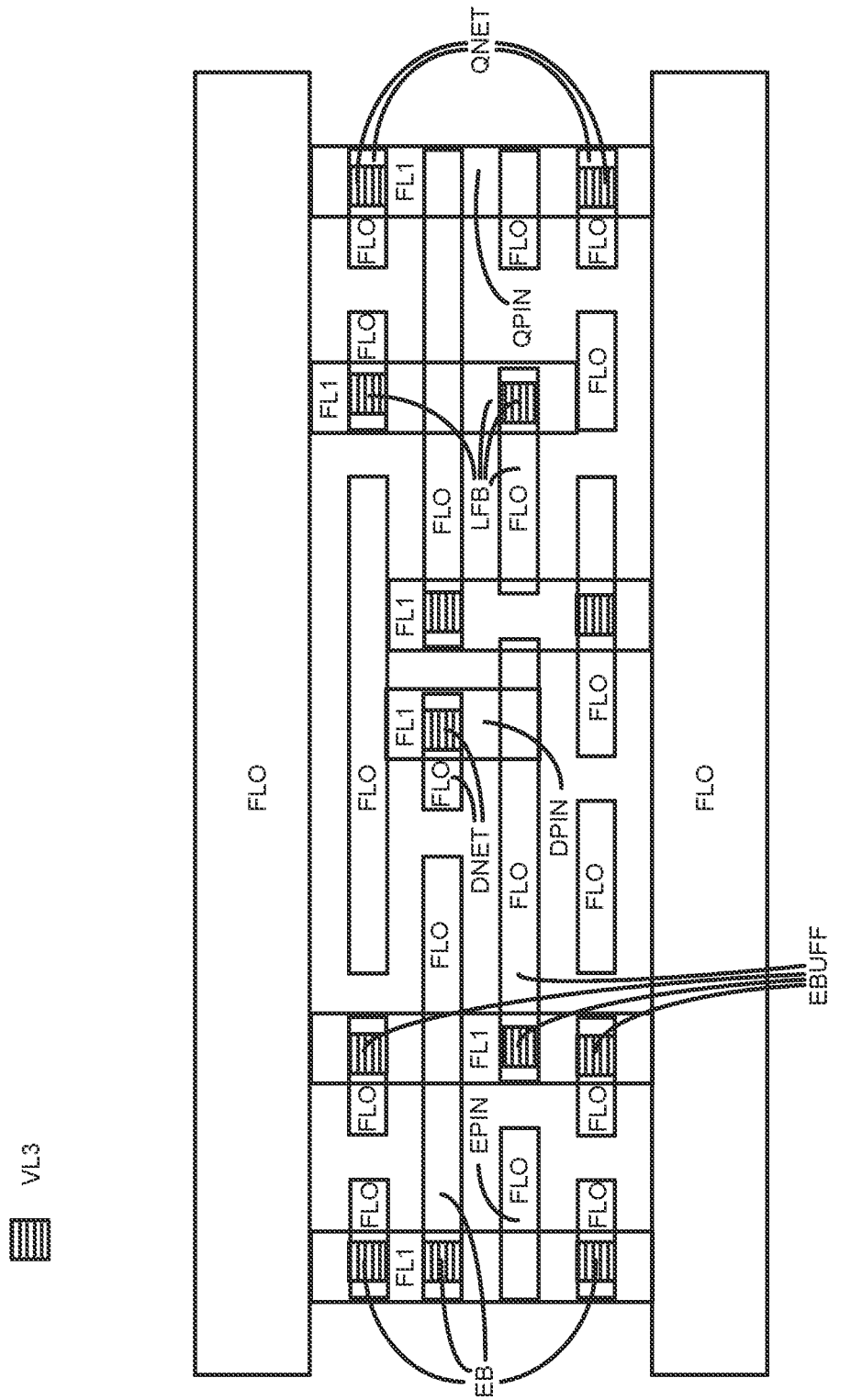
FIG. 8 is a block diagram illustrating top layers of the layout for the DLATCH circuit having the combinatorial gate corresponding to the AOI22 cell.

FIG. 8 illustrates top layers of the layout for the DLATCH circuit having the combinatorial gate corresponding to the AOI22 cell. A first portion of a first front end metal layer FL0 is provided as a pair of VDD and VSS power rails arranged horizontally across the polygate rails PLO. Additionally, horizontal metal plates provide a second portion of the first front end metal layer FL0. A metal via layer VL3 is provided as a plurality of metal plates arranged atop second portion of the first front end metal layer FL0. As a topmost layer, a second front end metal layer FL1 is provided as a plurality of vertical metal plates arranged atop the metal via layer VL3. Elements labeled as DNET (e.g., the first component of first front end metal layer FL0 and a first component of metal layer via VL3) function as part of the input signal internal net. Elements labeled as QNET (e.g., a fourth component of first front end metal layer FL0 and a second component of metal layer via VL3) function as part of an output signal internal net. Elements labeled as LFB (e.g., a third component of metal layer via VL3, a fourth component of metal layer via VL3, a fourth component of second front end metal layer FL1, and a fifth component of first front end metal layer FL0), function as elements of the latch feedback internal net. Elements labeled as DPIN, EPIN, and QPIN (e.g., first, second, and third components of second front end metal layer FL1) function as a data input component, an enable (e.g., clock) signal input component, and an output component, respectively.

Figure 9:
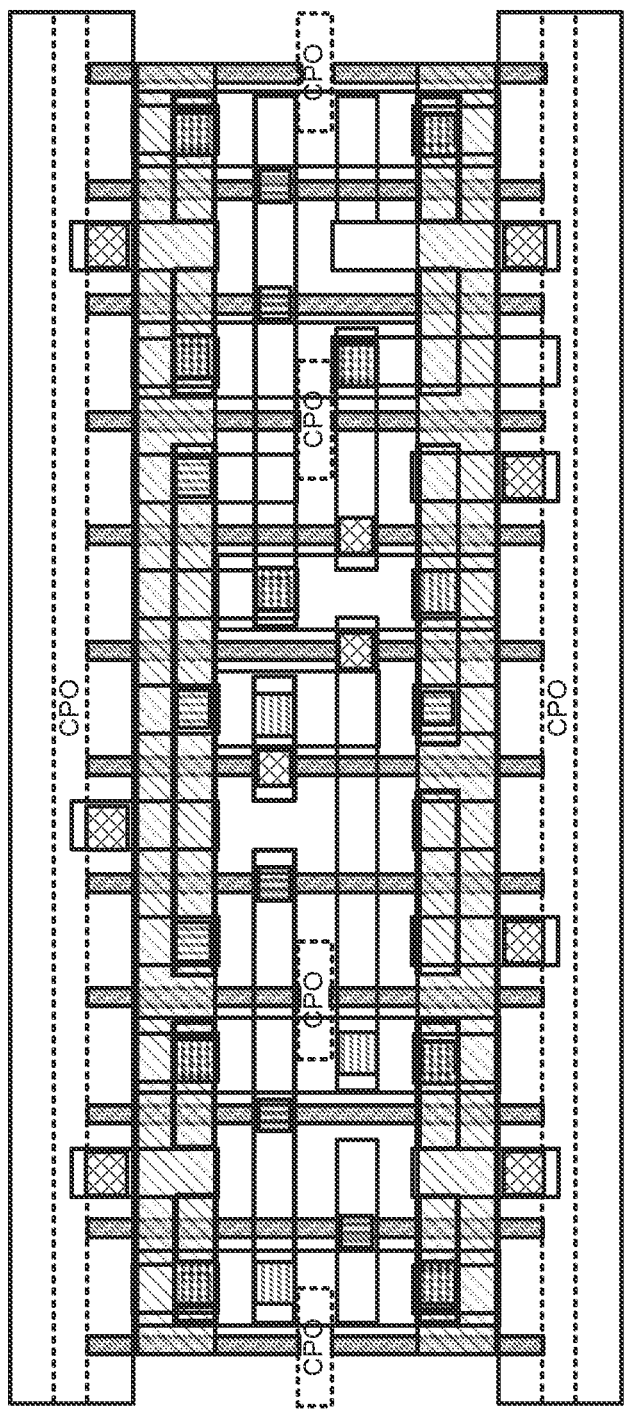
FIG. 9 is a block diagram illustrating total layers of the layout for the DLATCH circuit having the combinatorial gate corresponding to the AOI22 cell.

FIG. 9 illustrates total layers of the layout for the DLATCH circuit having the combinatorial gate corresponding to the AOI22 cell. Referring generally to FIGS. 6-9, the layers arranged from bottom to top are indicated below in Table 1, with the lowest layer listed at the top of Table 1 and the topmost layer listed at the bottom of Table 1.

TABLE 1

| Layers sorted from low to high, vertically | Reference Sign |
| --- | --- |
| NWELL | BL1 |
| PWELL | BL2 |
| Bottom Layer (e.g., Oxide Diffusion) | BL3 |
| Middle line metal layer | ML1 |
| Polygate Rails (e.g., Poly metal gate) | PO |
| Via drains (e.g., Contact VIA drain) | VL1 |
| Via gates (e.g., Contact VIA gate) | VL2 |
| First front end metal layer | FL0 |
| Metal Via Layer (e.g., through holes) | VL3 |
| Second front end metal layer | FL1 |

Compared to the tri-state circuit layout of FIG. 3, the more compact AOI22 cell has the inputs for data signal D, inverted enable signal EB, buffered enable signal EBUFF, and latch feedback signal LFB each aligned on separate polygate rails (e.g., polygate rails PO6, PO5, PO7, and PO8, respectively). Stated differently, the inputs for data signal D, inverted enable signal EB, buffered enable signal EBUFF, and latch feedback signal LFB are each aligned on exactly one of the polygate rails, and the polygate rails on which the inputs for data signal D, inverted enable signal EB, buffered enable signal EBUFF, and latch feedback signal LFB are each aligned are distinct and separate from one another. Thus, cross coupling of clock signals (e.g., enable signal E) is avoided. Additionally, the layout of FIG. 9 has fewer polygate rails (e.g., no more than twelve polygate rails and no more than eleven polygate rails in terms of cell width). Also, the layout of FIG. 9 has no cut polygates CPO at any of its active polygate rails and no dummy devices. As will be readily apparent to one skilled in the art, a layout for the OAI22 type DLATCH circuit has similar advantages due to alignment of the inputs for data signal D, inverted enable signal EB, buffered enable signal EBUFF, and latch feedback signal LFB each aligned on separate polygate rails. As will also be readily apparent to one skilled in the art, the OAI22 type DLATCH circuit further has the advantage of a delay skew (i.e., faster falling than rising) that is substantially equal and opposite to a delay skew (i.e., faster rising than falling) of the AOI22 type DLATCH circuit. Still further, the delay skew of the OAI22 type DLATCH circuit is opposite to another delay skew (i.e., faster rising than falling) of the tristate-gate type DLATCH circuit. As a result, the OAI22 type DLATCH circuit offers a delay skew compensation option in a DLATCH circuit that was previously unavailable.

Figure 10:
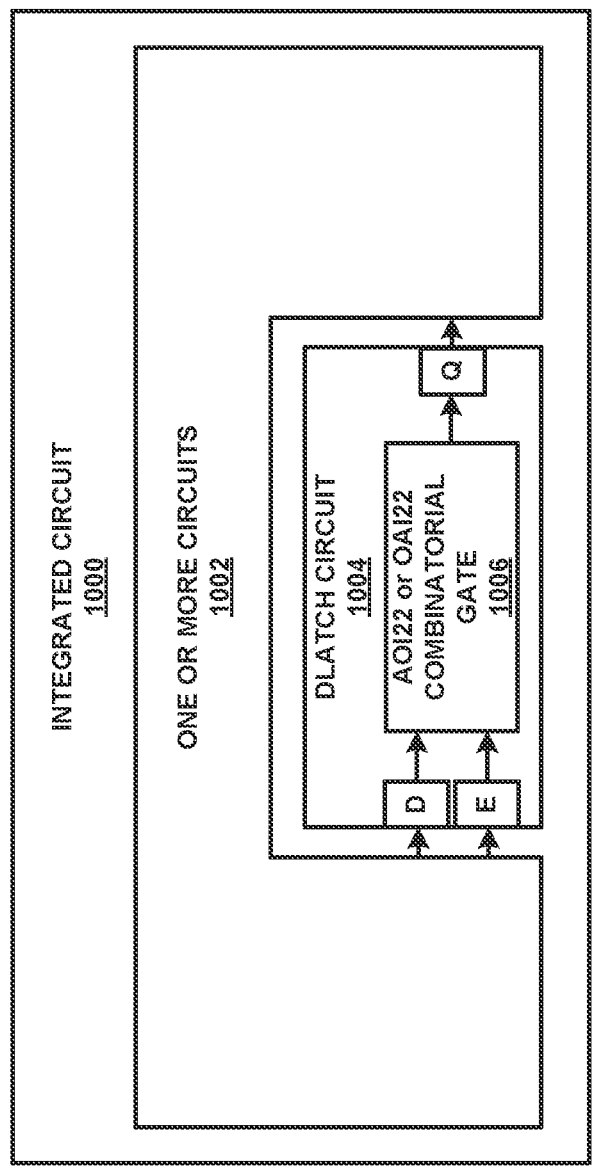
FIG. 10 is a block diagram illustrating an integrated circuit (IC) including a DLATCH circuit having a combinatorial gate corresponding to the AOI22 cell or the OAI22 cell.

FIG. 10 illustrates an integrated circuit (IC) 1000 including one or more circuits 1002 operatively connected to a DLATCH circuit 1004 having a combinatorial gate 1006 corresponding to the AOI22 cell or the OAI22 cell. The DLATCH circuit 1004 has an input component D configured to receive an input signal, such as a data signal. The DLATCH circuit 1004 also has a combinatorial gate 1006 configured to store a state of the input signal, and an output component Q configured to provide an output signal having the state stored by the combinatorial gate 1006.

Various implementations of the IC are configured in various ways. In some implementations, the combinatorial gate 1006 corresponds to an AND-OR-inverted (AOI22) cell. In other implementations, the combinatorial gate 1006 corresponds to an OR-AND-inverted (OAI22) cell. According to various implementations, the DLATCH circuit 1004 has no cross coupled clock signals and/or dummy metal oxide semiconductor (MOS) devices. In some implementations, a layout of the DLATCH circuit 1002 has no cut polygate on any active poly rail of the DLATCH circuit. In some implementations, the DLATCH circuit 1004 has another input component E configured to a receive an input signal, such as an enable signal (e.g., clock signal).

Advantageously, the AOI22 cell has a first delay skew (i.e., faster rising than falling) opposite a second delay skew (i.e., faster falling than rising) of the OAI22 cell. This feature provides an IC designer with an option of which cell type to use in the IC 1000 so that the DLATCH circuit 1004 is configured to compensate delay skew of the one or more circuits 1002 at a tile level of the IC 1000. For example, a designer of the IC 1000 may connect two of the disclosed DLATCH circuits 1004 in series to cancel each other's delay skew, one having an AOI22 cell-based combinatorial gate 1006 and the other having an OAI22 cell-based combinatorial gate 1006.

In other examples, a designer of IC 1000 may choose to use either the AOI22 cell or OAI22 cell type of DLATCH circuit 1004 to reduce or eliminate delay skew introduced by one or more circuits 1002 of the IC at a tile level. For example, in some implementations, the one or more input signals D and/or E has a delay skew introduced by one or more circuits 1002 that provide the input signal D and/or E. In these implementations, the delay skew of the input signal D and/or E is at least partially compensated by the delay skew introduced by the DLATCH circuit 1004, such that the output signal Q has a reduced delay skew compared to the delay skew of the input signal D and/or E. In these and other implementations, a delay skew of the output signal Q compensates another delay skew introduced by one or more circuits 1002 that receive the output signal Q.

The foregoing disclosure describes the implementation of a DLATCH (either a-phase or b-phase) by using compact AND-OR-inverted (AOI22) or OR-AND-inverted (OAI22) cells. Implementing the latch using compact AOI22/OAI22 cells ensures better cell area in standard cell libraries that have limited lower metal resources (e.g., any short standard cell libraries). In standard cell libraries with architecture having limited traces for the first metal in the stack, it can be difficult or impossible to implement a clocked DLATCH due to impossibility of cutting polygate rails and connecting to both PMOS and NMOS in the same Poly track. The disclosed implementation performs the DLATCH logic function without the need for any cross coupled clock signals. As a result, cutting of active polygate rails is not required, allowing for easier connections within the cells. Another new feature is the possibility of using either AOI22 or OAI22 cells for latch implementation. As a result, delay from input D to output Q can be skewed to either rise faster or fall faster, thus assisting in data path delay balancing at a tile level.

The disclosed DLATCH implementation exhibits numerous advantages. For example, there are no cuts on active polygate rails, which significantly reduces the number of connections within the cells and improves process yield. Additionally, the implementation allows for better cell area (e.g., 9% area benefit). This 9% area benefit at the cell level translates to a measurable chip level area benefit. Also, due to better routing at lower level, no dummy MOS devices are required, producing better delay for the new implementation (e.g., a 7% timing benefit is observed in a given technology at a given voltage and a given temperature).

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered example in nature since many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The preceding description has been provided to enable others skilled in the art to best utilize various aspects of the example embodiments disclosed herein. This example description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A method of operation for a data latch circuit, the method comprising:
   receiving, by an input component of the data latch circuit, an input signal, wherein a layout of the data latch circuit has inputs for a plurality of input signals each aligned on separate polygate rails;
   storing, by a combinatorial gate of the data latch circuit, a state of the input signal, wherein the combinatorial gate corresponds to at least one of an and-or-inverted cell or an or-and-inverted cell; and
   providing an output signal, by an output component of the data latch circuit, wherein the output signal has the state stored by the combinatorial gate.

2. The method of claim 1, wherein the combinatorial gate corresponds to the and-or-inverted cell.

3. The method of claim 1, wherein the combinatorial gate corresponds to the or-and-inverted cell.

4. The method of claim 3, wherein the or-and-inverted cell has a delay skew that is faster falling than rising, the method further comprising:
   compensating a faster rising than falling delay skew of one or more circuits of an integrated circuit at a tile level thereof.

5. The method of claim 1, wherein the data latch circuit has no cross coupled clock signals.

6. The method of claim 1, wherein the data latch circuit has no dummy metal oxide semiconductor devices.

7. The method of claim 1, wherein the layout of the data latch circuit has no cut polygate on any active polygate rail of the data latch circuit.

8. The method of claim 1, wherein the layout of the data latch circuit has no more than twelve polygate rails and no more than eleven polygate rails in terms of cell width.

9. The method of claim 1, wherein the layout of the data latch circuit has inputs for a data signal, an inverted enable signal, a buffered enable signal, and a latch feedback signal each aligned on separate polygate rails.

10. A data latch circuit, comprising:
   an input component configured to receive an input signal, wherein a layout of the data latch circuit has inputs for a plurality of input signals each aligned on separate polygate rails;
   a combinatorial gate configured to store a state of the input signal, wherein the combinatorial gate corresponds to at least one of an and-or-inverted cell or an or-and-inverted cell; and
   an output component configured to provide an output signal having the state stored by the combinatorial gate.

11. The data latch circuit of claim 10, wherein the combinatorial gate corresponds to the and-or-inverted cell.

12. The data latch circuit of claim 10, wherein the combinatorial gate corresponds to the or-and-inverted cell.

13. The data latch circuit of claim 12, wherein the or-and-inverted cell has a delay skew that is faster falling than rising, and the data latch circuit is configured to compensate a faster rising than falling delay skew of one or more circuits of an integrated circuit at a tile level thereof.

14. The data latch circuit of claim 10, wherein the data latch circuit has no cross coupled clock signals.

15. The data latch circuit of claim 10, wherein the data latch circuit has no dummy metal oxide semiconductor devices.

16. The data latch circuit of claim 10, wherein the layout of the data latch circuit has no cut polygate on any active polygate rail of the data latch circuit.

17. The data latch circuit of claim 10, wherein the layout of the data latch circuit has no more than twelve polygate rails and no more than eleven polygate rails in terms of cell width.

18. The data latch circuit of claim 10, wherein the layout of the data latch circuit has inputs for a data signal, an inverted enable signal, a buffered enable signal, and a latch feedback signal each aligned on separate polygate rails.

19. An integrated circuit comprising:
   one or more circuits; and
   a data latch circuit operatively connected to the one or more circuits,
   wherein the data latch circuit has an input component configured to receive an input signal, a combinatorial gate configured to store a state of the input signal, and an output component configured to provide an output signal having the state stored by the combinatorial gate,
   wherein a layout of the data latch circuit has inputs for a plurality of input signals each aligned on separate polygate rails, and
   wherein the combinatorial gate corresponds to at least one of an and-or-inverted cell or an or-and-inverted cell.

20. The integrated circuit of claim 19, wherein the combinatorial gate corresponds to the or-and-inverted cell, the or-and-inverted cell has a delay skew that is faster falling than rising, and the data latch circuit is configured to compensate a faster rising than falling delay skew of the one or more circuits at a tile level of the integrated circuit.

* * * * *